(12) United States Patent
Kawamura et al.

(10) Patent No.: US 10,707,243 B2
(45) Date of Patent: Jul. 7, 2020

(54) DISPLAY DEVICE INCLUDING GATE LINES AND GATE LEAD-OUT LINES FORMED IN SAME LAYER

(71) Applicant: Panasonic Liquid Crystal Display Co., Ltd., Himeji-shi, Hyogo (JP)

(72) Inventors: Tetsuya Kawamura, Hyogo (JP); Hironori Yasukawa, Hyogo (JP)

(73) Assignee: Panasonic Liquid Crystal Display Co., Ltd., Hyogo (JP)

( * ) Notice: Subject to any disclaimer, the term of this patent is extended or adjusted under 35 U.S.C. 154(b) by 0 days.

(21) Appl. No.: 16/207,747

(22) Filed: Dec. 3, 2018

(65) Prior Publication Data

US 2019/0103417 A1   Apr. 4, 2019

Related U.S. Application Data

(63) Continuation of application No. 15/728,116, filed on Oct. 9, 2017, now Pat. No. 10,177,175, which is a
(Continued)

(30) Foreign Application Priority Data

Sep. 29, 2014   (JP) .................................. 2014-199436

(51) Int. Cl.
*H01L 27/12* (2006.01)
*G09G 3/36* (2006.01)
(Continued)

(52) U.S. Cl.
CPC .............. *H01L 27/124* (2013.01); *G02F 1/13* (2013.01); *G02F 1/13452* (2013.01);
(Continued)

(58) Field of Classification Search
CPC .................................. H01L 27/124; G09G 3/10
See application file for complete search history.

(56) References Cited

U.S. PATENT DOCUMENTS

2003/0030381 A1 * 2/2003 Yamazaki ........... G02F 1/13454
315/169.1
2005/0140578 A1   6/2005 Yamazaki et al.
(Continued)

FOREIGN PATENT DOCUMENTS

JP   2003-058075   2/2003

OTHER PUBLICATIONS

Office Action issued in U.S. Appl. No. 15/693,916, dated Oct. 18, 2017, 11 pages.

*Primary Examiner* — Matthew E. Gordon
(74) *Attorney, Agent, or Firm* — Hamre, Schumann, Mueller & Larson, P.C.

(57) ABSTRACT

Provided is a display device, including: a plurality of gate lines extending in a first direction; a plurality of source lines extending in a second direction; a gate driver configured to output a gate signal; and a plurality of gate lead-out lines extending in the second direction and being configured to transmit the gate signal to the plurality of gate lines, in which each of the plurality of gate lines is electrically connected to at least one of the plurality of gate lead-out lines, and at least one of the plurality of gate lines is electrically connected to at least two of the plurality of gate lead-out lines.

5 Claims, 16 Drawing Sheets

Related U.S. Application Data continuation of application No. 14/867,430, filed on Sep. 28, 2015, now Pat. No. 9,837,443.

(51) Int. Cl.
    *G02F 1/1345* (2006.01)
    *G02F 1/13* (2006.01)

(52) U.S. Cl.
    CPC ... *G09G 3/3674* (2013.01); *G09G 2300/0426* (2013.01); *G09G 2310/0281* (2013.01)

(56) References Cited

U.S. PATENT DOCUMENTS

| | | |
|---|---|---|
| 2006/0071884 A1 | 4/2006 | Kim |
| 2010/0066967 A1 | 3/2010 | Takahashi et al. |
| 2010/0073272 A1 | 3/2010 | Yamazaki et al. |
| 2012/0313907 A1 | 12/2012 | Yamazaki et al. |
| 2014/0152938 A1 | 6/2014 | Lee |
| 2015/0293546 A1 | 10/2015 | Tanaka et al. |
| 2015/0379955 A1 | 12/2015 | Jeon et al. |
| 2016/0020224 A1 | 1/2016 | Kawamura et al. |

* cited by examiner

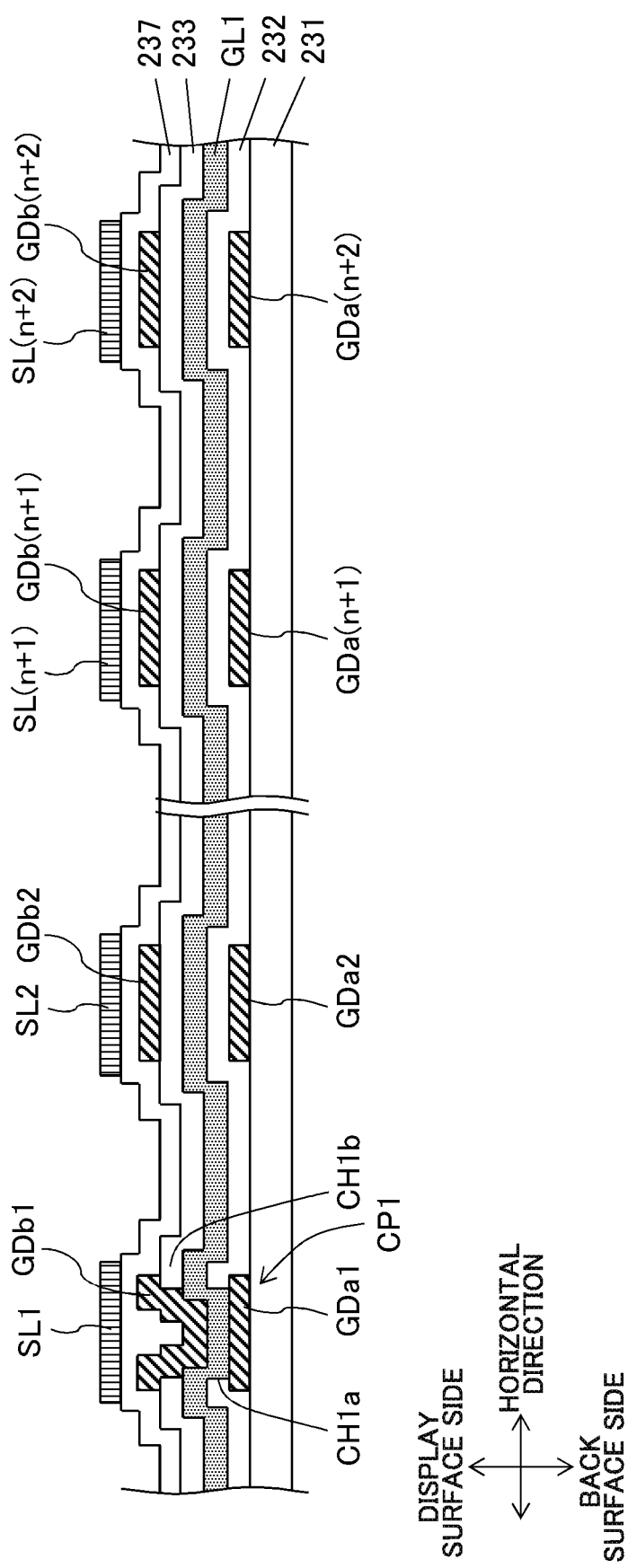

DISPLAY DEVICE INCLUDING GATE LINES AND GATE LEAD-OUT LINES FORMED IN SAME LAYER

CROSS-REFERENCE TO RELATED APPLICATION

The present application claims priority from Japanese application JP2014-199436 filed on Sep. 29, 2014, the content of which is hereby incorporated by reference into this application.

BACKGROUND OF THE INVENTION

1. Field of the Invention

The present application relates to a display device.

2. Description of the Related Art

Hitherto, in display devices such as liquid crystal display devices, there has been proposed a technology for realizing reduction in area of a frame region surrounding a display region (so-called narrowing of a frame). For example, in Japanese Patent Application Laid-open No. 2003-58075, there is disclosed a configuration in which a gate signal line driving circuit (gate driver) and a source signal line driving circuit (source driver) are arranged parallel to each other on one side of the display region, to thereby narrow the frame.

Further, in the above-mentioned literature, there is also disclosed a configuration in which a lead-out gate signal line, which is configured to transmit a gate signal output from the gate signal line driving circuit to a gate signal line, and a source signal line are arranged to overlap with each other, to thereby prevent reduction in pixel aperture ratio.

SUMMARY OF THE INVENTION

However, in the configuration disclosed in the above-mentioned literature, in order to prevent the reduction in aperture ratio, the width of the lead-out gate signal line is set smaller than the width of the source signal line. Therefore, the resistance to the gate signal in the lead-out gate signal line is larger than the resistance to the gate signal in the gate signal line. Therefore, there is a problem in that the entire display region is increased in resistance to thereby cause display unevenness or the like, which leads to reduction in display quality.

The present application has been made in view of the above-mentioned circumstances, and has an object to provide a display device capable of narrowing a frame without reducing a pixel aperture ratio and display quality.

In order to solve the above-mentioned problems, according to one embodiment of the present application, there is provided a display device, including: a plurality of gate lines extending in a first direction; a plurality of source lines extending in a second direction different from the first direction; a gate driver configured to output a gate signal; and a plurality of gate lead-out lines extending in the second direction and being configured to transmit the gate signal output from the gate driver to the plurality of gate lines, in which each of the plurality of gate lines is electrically connected to at least one of the plurality of gate lead-out lines, and at least one of the plurality of gate lines is electrically connected to at least two of the plurality of gate lead-out lines.

The display device according to one embodiment of the present application may further include a first insulating film formed between the plurality of gate lines and the plurality of gate lead-out lines. In the display device, the each of the plurality of gate lines and each of the plurality of gate lead-out lines may be electrically connected to each other via a contact hole formed through the first insulating film.

In the display device according to one embodiment of the present application, each of the plurality of gate lead-out lines may have a width that is equal to or less than a width of each of the plurality of source lines, and, in plan view, the each of the plurality of gate lead-out lines and the each of the plurality of source lines may overlap with each other.

The display device according to one embodiment of the present application may further include a second insulating film formed between the plurality of gate lines and the plurality of source lines. In the display device, the first insulating film may be formed on the plurality of gate lead-out lines, the plurality of gate lines may be formed on the first insulating film, the second insulating film may be formed on the plurality of gate lines, and the plurality of source lines may be formed on the second insulating film.

In the display device according to one embodiment of the present application, a number of the plurality of gate lead-out lines electrically connected to corresponding one of the plurality of gate lines, which is arranged at a position far from a location where the gate driver is arranged, may be larger than a number of the plurality of gate lead-out lines electrically connected to corresponding one of the plurality of gate lines, which is arranged at a position close to the location where the gate driver is arranged.

In the display device according to one embodiment of the present application, a connecting portion formed between a first gate line, which is arranged at a position far from a location where the gate driver is arranged, and corresponding one of the plurality of gate lead-out lines may be arranged on a lateral side of a display region with respect to a connecting portion formed between a second gate line, which is arranged at a position closer to the location where the gate driver is arranged than the first gate line, and corresponding one of the plurality of gate lead-out lines.

The display device according to one embodiment of the present application may further include a transistor connected to a pixel electrode in a pixel region sectioned by adjacent two of the plurality of source lines, adjacent two of the plurality of gate lines, and four intersecting portions at which the adjacent two of the plurality of source lines and the adjacent two of the plurality of gate lines intersect with each other. In the display device, the transistor being arranged at one intersecting portion different from another intersecting portion at which a connecting portion formed between corresponding one of the plurality of gate lines and corresponding one of the plurality of gate lead-out lines is positioned.

The display device according to one embodiment of the present application may further include a plurality of bundled lines each formed by bundling a predetermined number of the plurality of gate lead-out lines outside of a display region. In the display device, each of the plurality of bundled lines may be configured to transmit the gate signal output from the gate driver to the predetermined number of the plurality of gate lead-out lines.

In the display device according to one embodiment of the present application, the each of the plurality of bundled lines may be formed by bundling a plurality of adjacent gate lead-out lines outside of the display region.

In the display device according to one embodiment of the present application, an interval between two of a plurality of connecting portions formed between one of the plurality of gate lines and a plurality of the gate lead-out lines electrically connected thereto may be equal to an interval between two of a plurality of connecting portions formed between another of the plurality of gate lines and a plurality of the gate lead-out lines electrically connected thereto.

In the display device according to one embodiment of the present application, the gate driver may be configured to output the gate signal to the plurality of gate lead-out lines electrically connected to the same gate line within the same horizontal scanning period.

In the display device according to one embodiment of the present application, the each of the plurality of gate lines may be electrically connected to a plurality of the gate lead-out lines adjacent to each other in the first direction.

BRIEF DESCRIPTION OF THE DRAWINGS

FIG. 16 is a sectional view in a liquid crystal display device according to a sixth embodiment of the present application.

DETAILED DESCRIPTION OF THE INVENTION

One embodiment of the present application is described below with reference to the drawings. In the following, a liquid crystal display device is given as an example, but the display device according to the present application is not limited to a liquid crystal display device, and may be an organic electroluminescence (EL) display device, for example. Further, in the following, a plurality of modes of the liquid crystal display device are described. Descriptions of components and functions common in respective embodiments are omitted as appropriate.

First Embodiment

Figure 1:
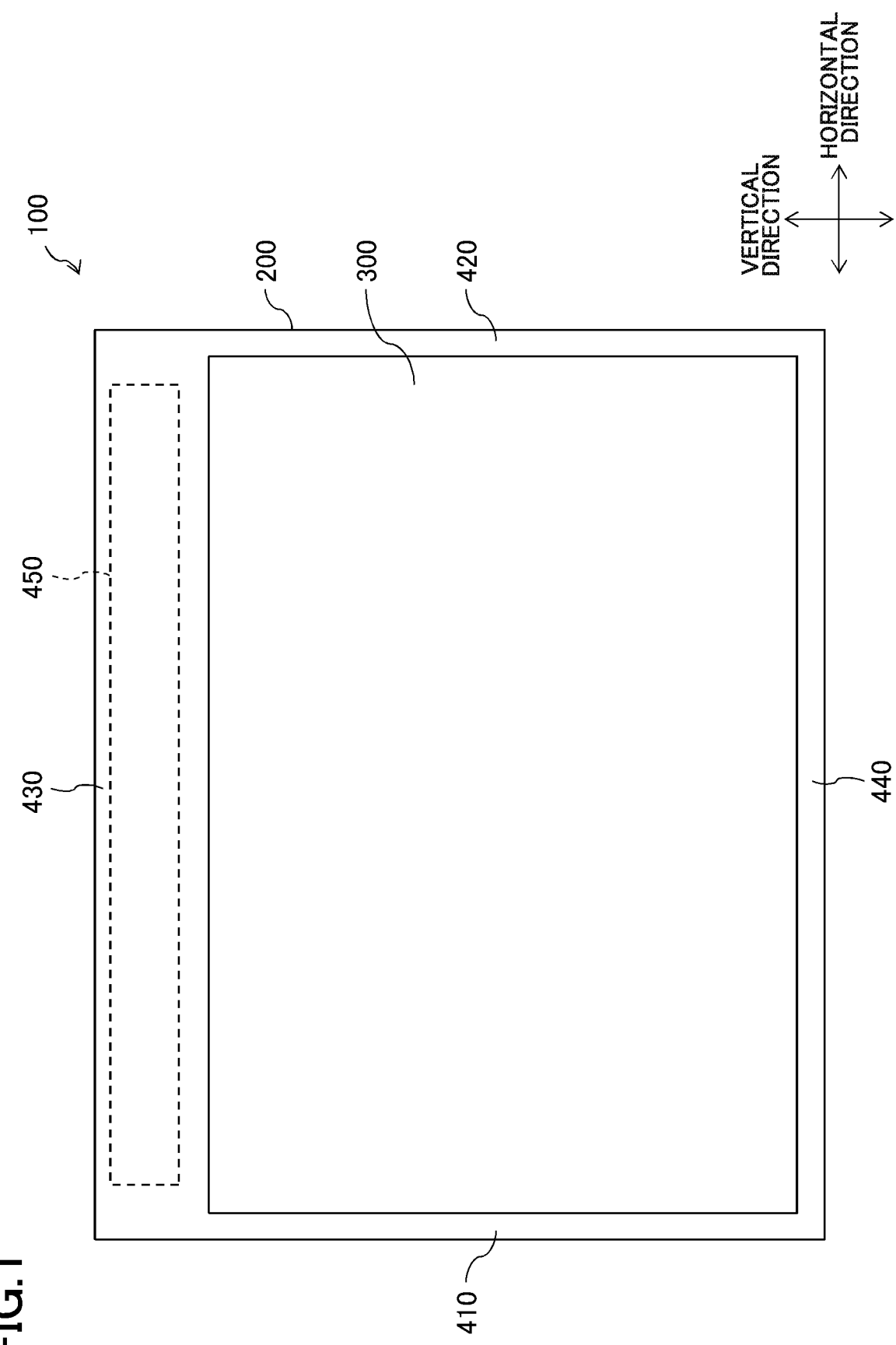
FIG. 1 is a plan view for illustrating a schematic configuration of a liquid crystal display device according to a first embodiment of the present application.

FIG. 1 is a plan view for illustrating a schematic configuration of a liquid crystal display device according to a first embodiment of the present application. A liquid crystal display device 100 mainly includes a display panel 200, and a backlight unit (not shown) arranged on the back surface side of the display panel 200. The display panel 200 includes, when roughly divided in region, a display region 300 for displaying an image, and a frame region positioned around the display region 300. The frame region includes, as viewed from a viewer, a left region 410 on the leftward outer side (left side) of the display region 300, a right region 420 on the rightward outer side (right side) of the display region 300, an upper region 430 on the upward outer side (upper side) of the display region 300, and a lower region 440 on the downward outer side (lower side) of the display region 300.

The frame region includes, on one side thereof, a driving circuit region 450 for arranging driving circuits (gate driver and source driver) for displaying an image. In this liquid crystal display device 100, the driving circuit region 450 is included in the upper region 430. The location of the driving circuit region 450 in the frame region is not limited, and is determined depending on the structure of the liquid crystal display device 100 (such as a vertical type or a lateral type). Further, the driving circuit region 450 may be included in the frame region on only one side, or may be included on two opposing sides across the display region 300. Further, the driving circuit region 450 may be included in a circuit board provided outside of the display panel 200. The driving circuit region 450 may include, in addition to the gate driver and the source driver, a common voltage generating circuit and a control circuit (not shown).

Figure 2:
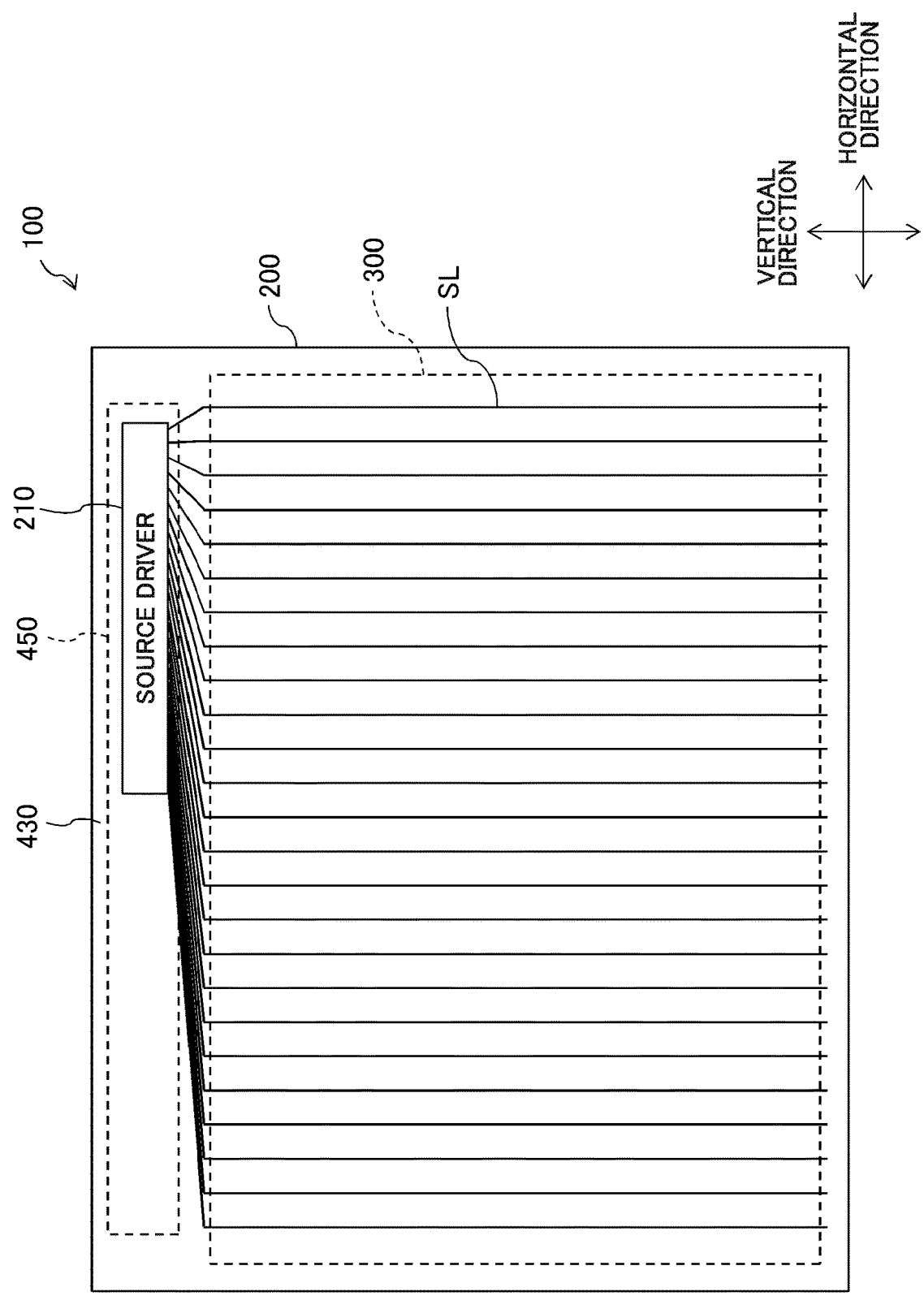
FIG. 2 is a plan view for illustrating arrangement of a source driver and source lines.

FIG. 2 is a plan view for illustrating arrangement of the source driver and source lines. The liquid crystal display device 100 includes a plurality of source lines SL, and a source driver 210 configured to output a video signal (source signal) to each source line SL. The source driver 210 is arranged in the upper region 430. Each source line SL is connected to the source driver 210, and is extended in a vertical direction (second direction). Further, the plurality of source lines SL are arranged at substantially equal intervals in a horizontal direction (first direction).

Figure 3:
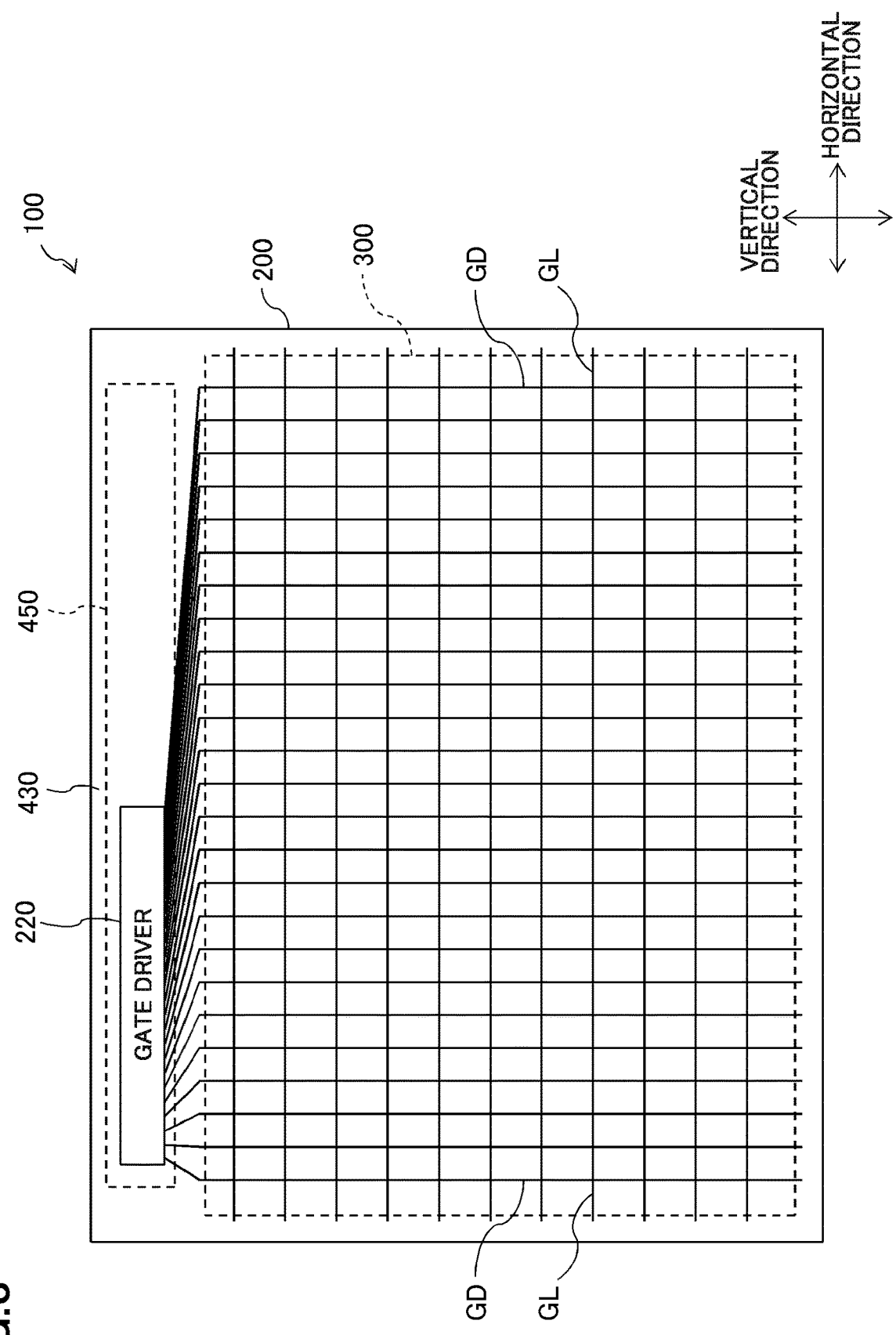
FIG. 3 is a plan view for illustrating arrangement of a gate driver and gate lines.

FIG. 3 is a plan view for illustrating arrangement of the gate driver and gate lines. The liquid crystal display device 100 includes a plurality of gate lines GL, a plurality of gate lead-out lines GD, and a gate driver 220. The gate driver 220 is arranged next to the source driver 210 in the horizontal direction in the upper region 430. Note that, the gate driver 220 may be arranged next to the source driver 210 in the vertical direction in the upper region 430. Each gate line GL is extended in the horizontal direction. Further, the plurality of gate lines GL are arranged at substantially equal intervals in the vertical direction. Each gate lead-out line GD is electrically connected to the gate driver 220, and is extended in the vertical direction. Further, the plurality of gate lead-out lines GD are arranged at substantially equal intervals in the horizontal direction. In plan view, the gate lead-out line GD is arranged to intersect with the gate line GL, and so that the gate lead-out line GD and the source line SL overlap with each other. Details are described later, but the source line SL, the gate line GL, and the gate lead-out line GD are formed in layers different from each other through intermediation of insulating films.

The gate driver 220 outputs a gate signal as a scanning signal to each gate lead-out line GD. Each gate lead-out line GD is electrically connected to each gate line GL. As a result, the gate signal is transmitted to each gate line GL through each gate lead-out line GD. The display panel 200 displays an image in the display region 300 based on the source signal and the gate signal.

In this case, the display region 300 of this liquid crystal display device 100 has a horizontally-long shape. For example, the screen ratio (width:height) of the liquid crystal display device 100 is 16:9, 16:10, or 15:10. Therefore, the ratio (m:n) between the number (m) of the source lines SL (for respective RGB) and the number (n) of the gate lines GL is 48:9, 48:10, or 45:10. Further, the ratio (m/n) of the number of the source lines SL to one gate line GL is 5.3, 4.8, or 4.5. As described above, the liquid crystal display device 100 has a configuration in which the number (m) of the source lines SL is larger than the number (n) of the gate lines (m>n).

Figure 4:
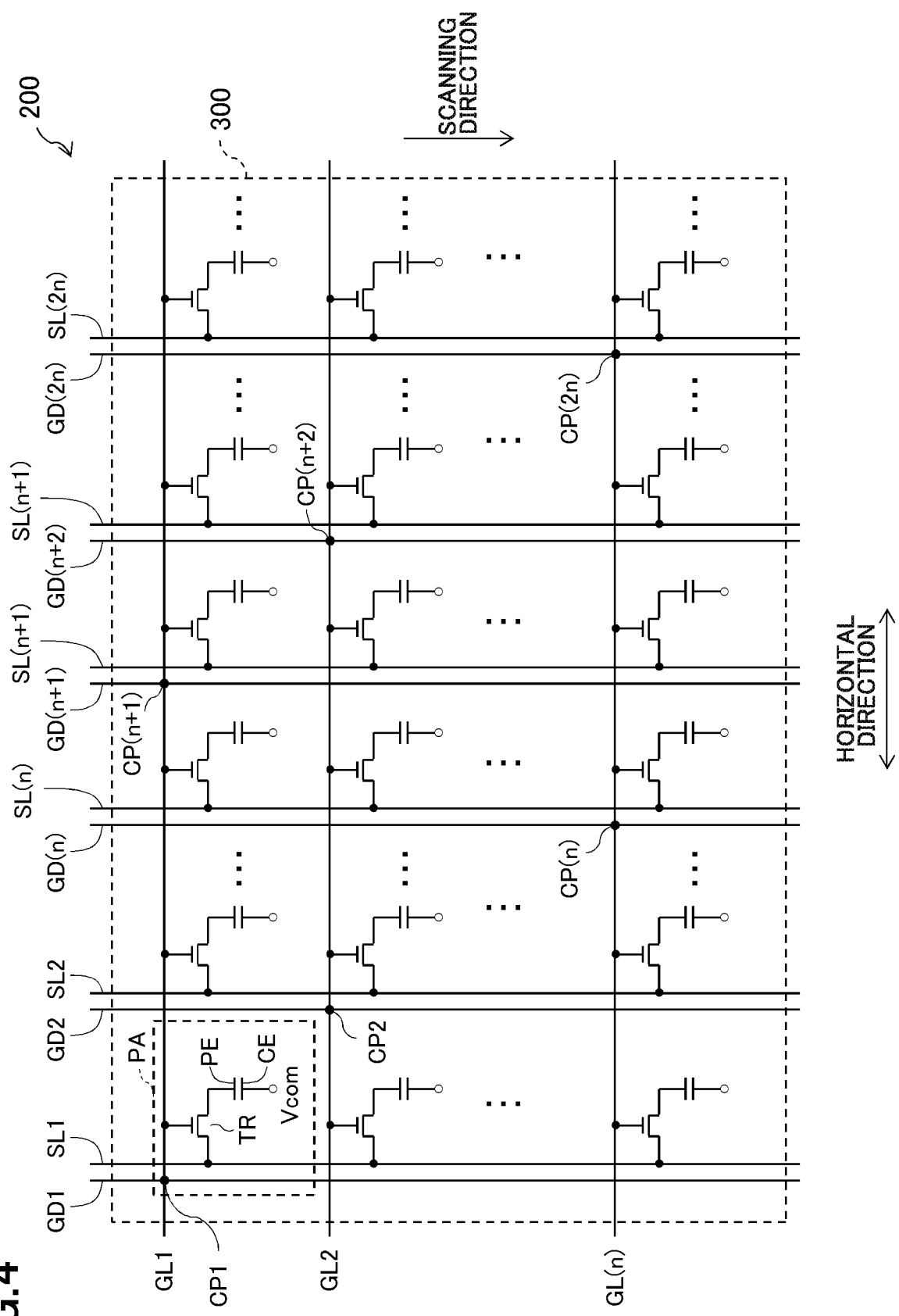
FIG. 4 is a circuit diagram for illustrating a schematic configuration of pixel regions of a display panel.

FIG. 4 is a circuit diagram for illustrating a schematic configuration of pixel regions of the display panel 200. In FIG. 4, for convenience in description, the gate lead-out line GD and the source line SL are arranged parallel side by side in plan view, but in the lamination structure of this liquid crystal display device 100, those lines are arranged to overlap with each other.

In the display region 300 of the display panel 200, a plurality of pixel regions PA sectioned by the plurality of (n) gate lines GL and the plurality of (m) source lines SL are arranged in matrix. The display panel 200 includes a plurality of pixel electrodes PE formed in the plurality of pixel regions PA, a common electrode CE corresponding to the plurality of pixel electrodes PE, and a plurality of transistors TR formed in vicinities of respective intersecting portions between the respective gate lines GL and the respective source lines SL. Each gate lead-out line GD is electrically connected to one gate line GL at one of a plurality of intersecting portions between the gate lead-out line GD and the plurality of gate lines GL. The intersecting portion at which the gate lead-out line GD and the gate line GL are electrically connected to each other is referred to as a "connecting portion CP".

The connecting portions CP are arranged in accordance with a certain rule based on a scanning direction (vertical direction) in which the plurality of gate lines GL are arranged, and based on the horizontal direction in which the gate lead-out lines GD are arranged. Further, two connecting portions CP are arranged for one gate line GL. For example, as illustrated in FIG. 4, a connecting portion CP1 is arranged at an intersecting portion between a first gate line GL1 and a gate lead-out line GD1, a connecting portion CP2 is arranged at an intersecting portion between a second gate line GL2 and a gate lead-out line GD2, and a connecting portion CP (n) is arranged at an intersecting portion between a last (n-th) gate line GL (n) and a gate lead-out line GD (n). Further, a connecting portion CP(n+1) is arranged at an intersecting portion between the gate line GL1 and a gate lead-out line GD (n+1), a connecting portion CP(n+2) is arranged at an intersecting portion between the gate line GL2 and a gate lead-out line GD(n+2), and a connecting portion CP(2n) is arranged at an intersecting portion between the gate line GL(n) and a gate lead-out line GD(2n). Note that, the above-mentioned variable "n" represents the number of the gate lines GL. The above-mentioned variable "2n" represents a number that is twice the number (n) of the gate lines GL, and also represents the number of the gate lead-out lines GD. The variables have similar meanings in the following description as well.

As described above, in the example illustrated in FIG. 4, two connecting portions CP are arranged for one gate line GL, and two gate lead-out lines GD are electrically connected to each gate line GL.

Figure 5:
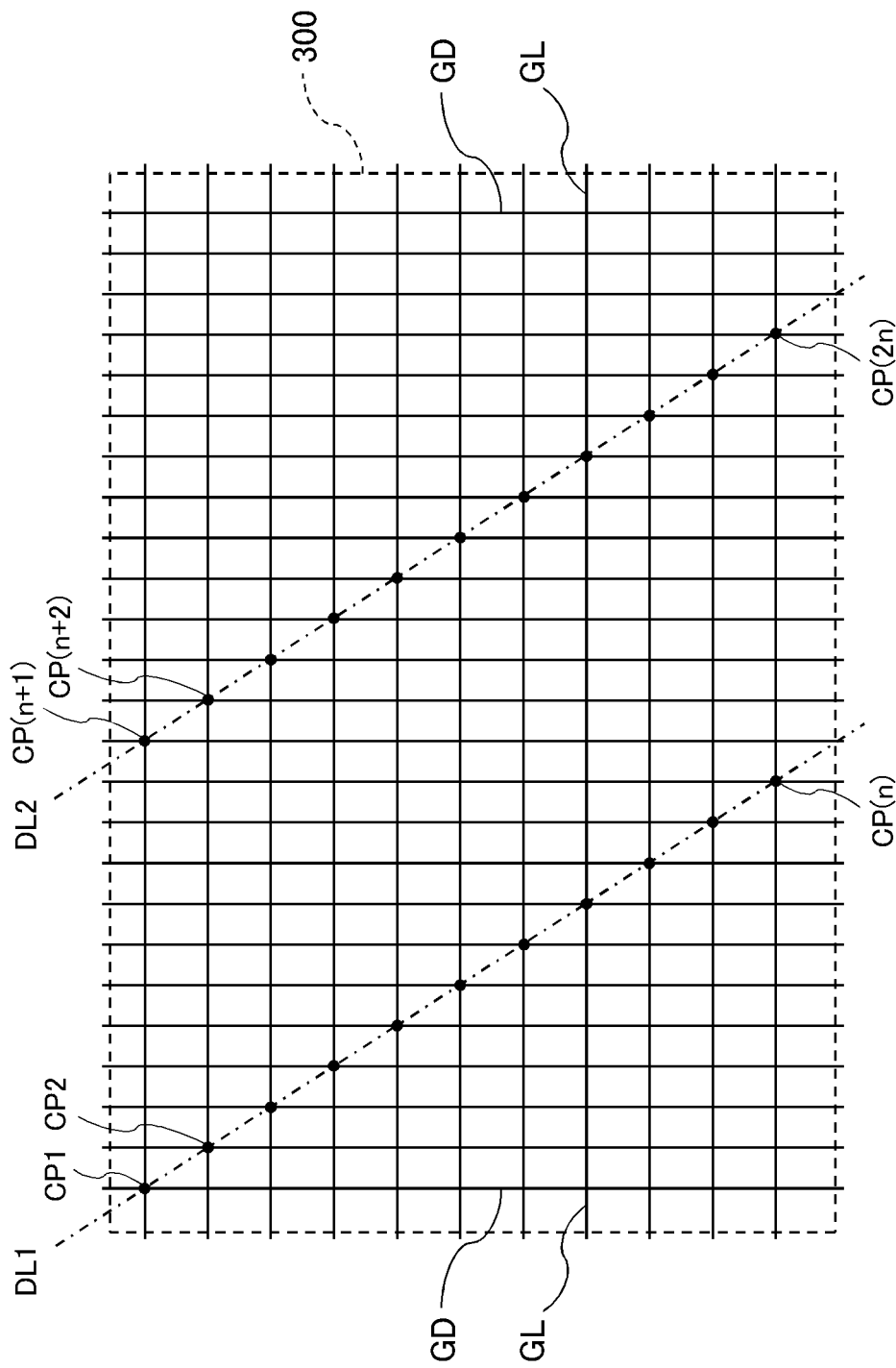
FIG. 5 is a plan view for schematically illustrating positions of connecting portions.

FIG. 5 is a plan view for schematically illustrating the positions of the connecting portions CP in the display region 300. As illustrated in FIG. 5, in the display region 300, the connecting portion CP1 is arranged at the upper left end, the connecting portion CP2 is arranged at the lower right of the connecting portion CP1, and subsequently the connecting portions are arranged in one row in the lower right direction to the connecting portion CP(n). Further, the connecting portion CP(n+1) is arranged at the upper end in the vicinity of the center of the display region 300, the connecting portion CP(n+2) is arranged at the lower right of the connecting portion CP(n+1), and subsequently the connecting portions are arranged in one row in the lower right direction to the connecting portion CP(2n). That is, the connecting portions CP1 to CP(n) are arranged on a diagonal line DL1 connecting the upper left end and the lower right end of each pixel region PA, and the connecting portions CP(n+1) to CP(2n) are arranged on a diagonal line DL2 connecting the upper left end and the lower right end of each pixel region PA. Note that, the connecting portions CP are arranged so that the diagonal lines DL1 and DL2 are parallel to each other. As described above, the interval between the two connecting portions CP connected to one gate line GL is the same in all of the gate lines.

Figure 6:
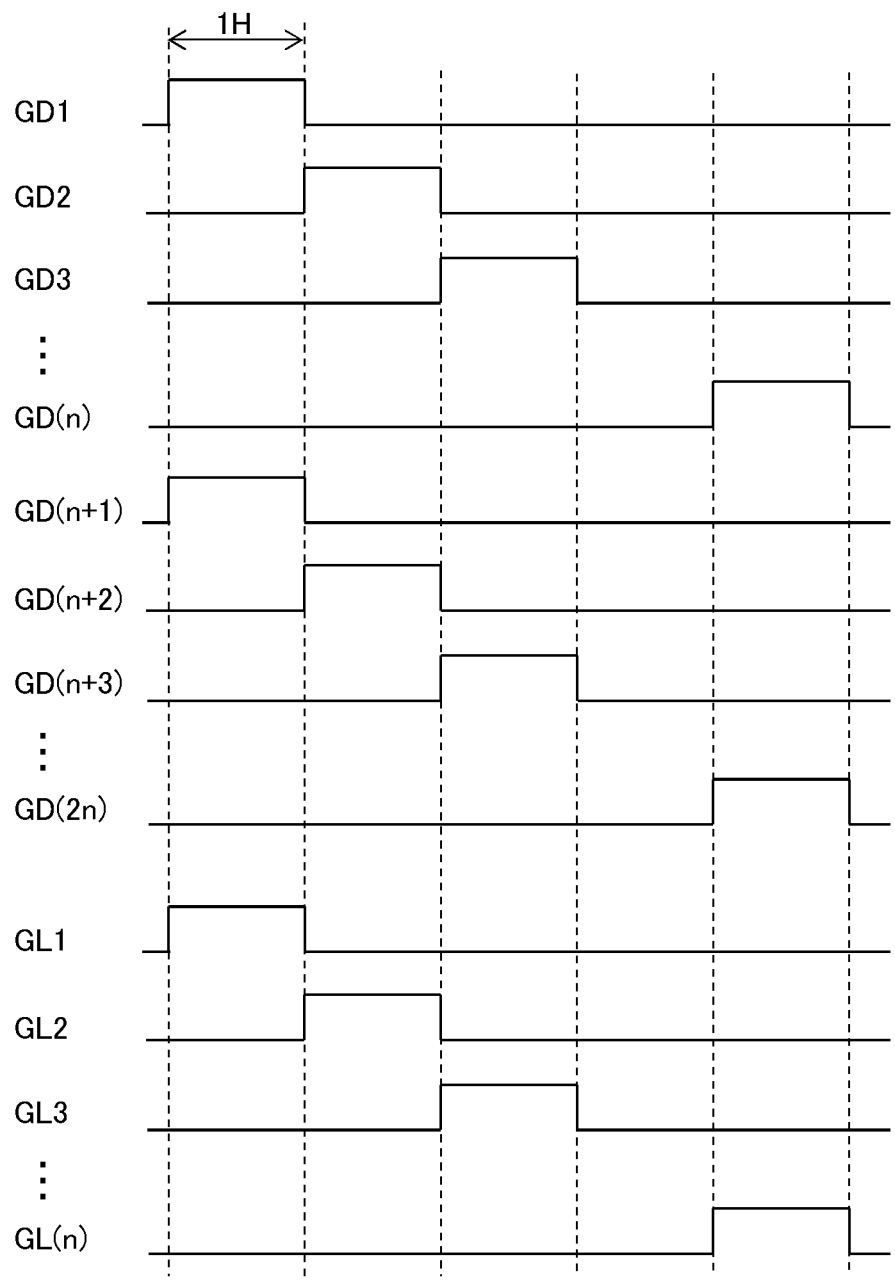
FIG. 6 is a timing chart for illustrating output timings of a gate signal.

Next, a method of driving the gate driver 220 is described. FIG. 6 is a timing chart for illustrating output timings of a gate signal output from the gate driver 220. The gate driver 220 sequentially supplies the gate signal (on voltage, off voltage) to each gate line GL. Further, two gate lead-out lines GD are electrically connected to each gate line GL, and the gate signal output from the gate driver 220 is supplied to one gate line GL through two gate lead-out lines GD. Therefore, the gate driver 220 outputs the same gate signal simultaneously to two gate lead-out lines GD.

Specifically, in a first horizontal scanning period, the gate driver 220 outputs the on voltage simultaneously to the gate lead-out lines GD1 and GD(n+1), to thereby supply the on voltage to the gate line GL1. Subsequently, in a second horizontal scanning period, the gate driver 220 outputs the on voltage simultaneously to the gate lead-out lines GD2 and GD(n+2), to thereby supply the on voltage to the gate line GL2. Subsequently, in a third horizontal scanning period, the gate driver 220 outputs the on voltage simultaneously to the gate lead-out lines GD3 and GD (n+3), to thereby supply the on voltage to the gate line GL3. As described above, the gate signal (on voltage, off voltage) is sequentially supplied from the first gate line GL1 to the n-th gate line GL(n).

The source driver 210 outputs the source signal to each source line SL in synchronization with the output timing of the on voltage and the off voltage of the gate signal. A known configuration can be applied to the source driver 210.

Figure 7:
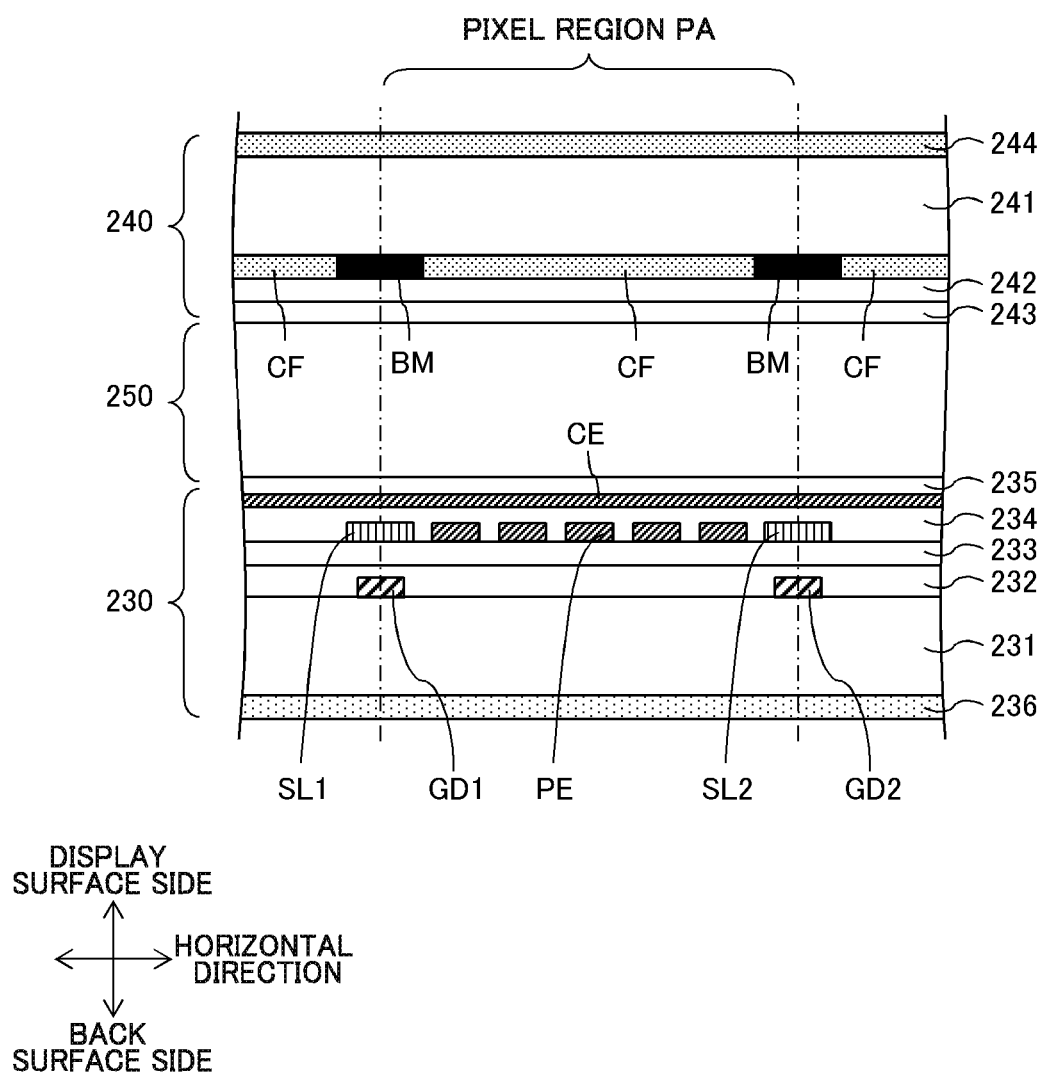
FIG. 7 is a sectional view for illustrating a schematic configuration of the display panel.
Figure 8:
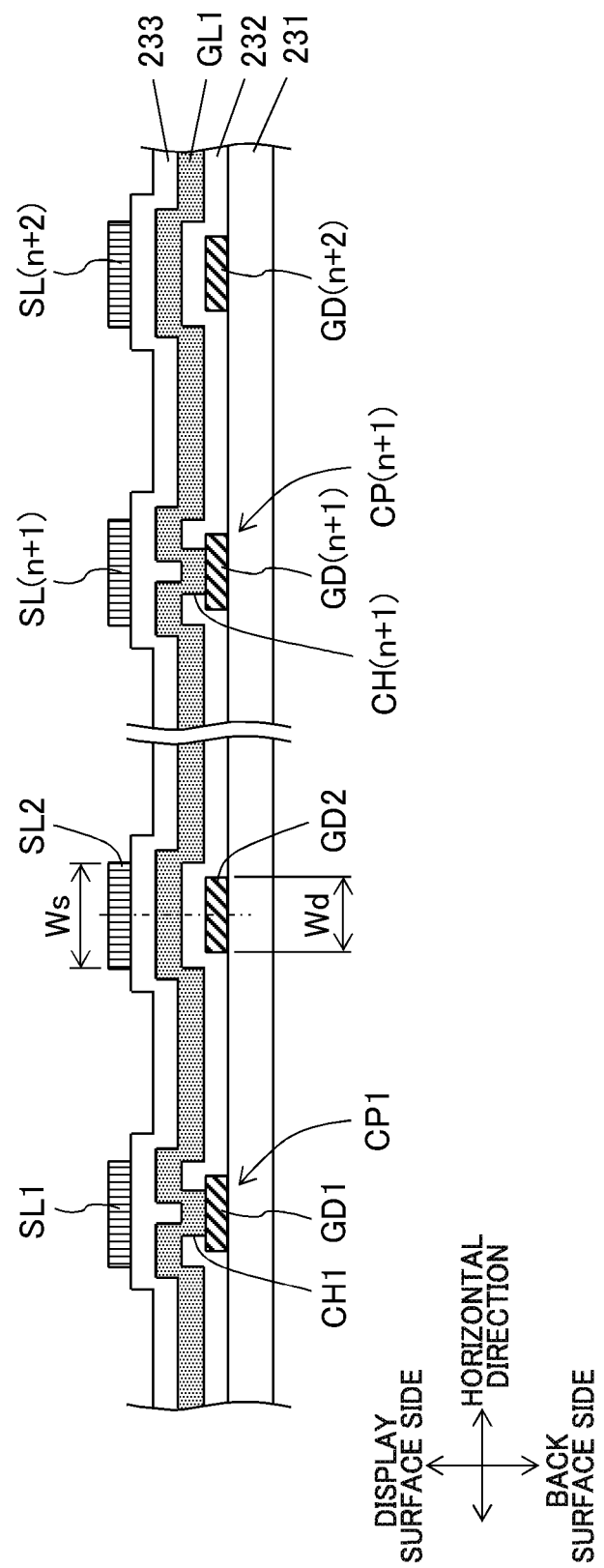
FIG. 8 is a sectional view for illustrating a schematic configuration of the display panel.
Figure 9:
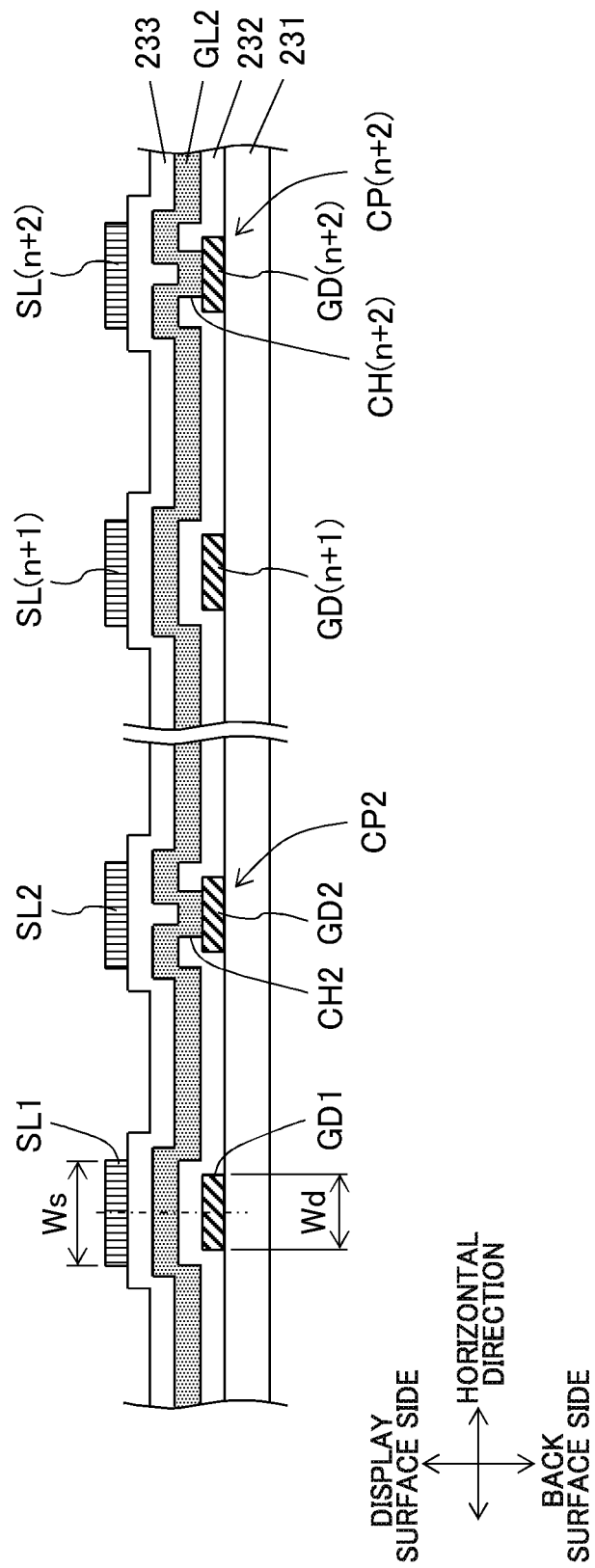
FIG. 9 is a sectional view for illustrating a schematic configuration of the display panel.

FIG. 7 to FIG. 9 are sectional views for illustrating a schematic configuration of the display panel 200. FIG. 7 is a sectional view of a case where the pixel region PA between the gate line GL1 and the gate line GL2 is cut in the horizontal direction. FIG. 8 is a sectional view of a case where a region along the gate line GL1 is cut in the horizontal direction. FIG. 9 is a sectional view of a case where a region along the gate line GL2 is cut in the horizontal direction. Note that, in FIG. 8 and FIG. 9, a part of a thin film transistor substrate (TFT substrate) is illustrated.

The display panel 200 includes a thin film transistor substrate (TFT substrate 230) arranged on a back surface side, a color filter substrate (CF substrate 240) arranged on a display surface side and opposed to the TFT substrate 230, and a liquid crystal layer 250 sandwiched between the TFT substrate 230 and the CF substrate 240. In the TFT substrate 230, the gate lead-out lines GD are formed on a glass substrate 231, a first insulating film 232 is formed so as to cover the gate lead-out lines GD, the gate lines GL are formed on the first insulating film 232, a second insulating film 233 is formed so as to cover the gate lines GL, and the source lines SL are formed on the second insulating film 233. Further, on the second insulating film 233, the pixel electrode PE is formed so that a part thereof overlaps with the source line SL, a third insulating film 234 is formed so as to cover the pixel electrode PE, the common electrode CE is formed on the third insulating film 234, and an alignment film 235 is formed so as to cover the source lines SL and the common electrode CE. The pixel electrode PE has slits formed therein. In the CF substrate 240, a black matrix BM and color filters CF are formed on a glass substrate 241, an overcoat film 242 is formed so as to cover those films, and an alignment film 243 is formed on the overcoat film 242. On the outer sides of the TFT substrate 230 and the CF substrate 240, polarizing plates 236 and 244 are formed.

As illustrated in FIG. 8, a contact hole CH1 is formed through the first insulating film 232 above the gate lead-out line GD1, and a metal material of the gate line GL1 is filled in the contact hole CH1. A part in the contact hole CH1 where the gate lead-out line GD1 and the metal materials of the gate line GL1 are brought into contact with each other forms the connecting portion CP1, and the gate lead-out line GD1 and the gate line GL1 are electrically connected to each other at the connecting portion CP1. Further, a contact hole CH(n+1) is formed through the first insulating film 232 above the gate lead-out line GD(n+1), and a metal material of the gate line GL1 is filled in the contact hole CH(n+1). A part of the contact hole CH(n+1) where the gate lead-out line GD(n+1) and the metal materials of the gate line GL1 are brought into contact with each other forms the connecting portion CP(n+1), and the gate lead-out line GD (n+1) and the gate line GL1 are electrically connected to each other at the connecting portion CP (n+1). As described above, the gate line GL1 is electrically connected to two gate lead-out lines GD1 and GD(n+1) at two connecting portions CP1 and CP(n+1).

Similarly, as illustrated in FIG. 9, a contact hole CH2 is formed through the first insulating film 232 above the gate lead-out line GD2, and a metal material of the gate line GL2 is filled in the contact hole CH2. A part in the contact hole CH2 where the gate lead-out line GD2 and the metal materials of the gate line GL2 are brought into contact with each other forms the connecting portion CP2, and the gate lead-out line GD2 and the gate line GL2 are electrically connected to each other at the connecting portion CP2. Further, a contact hole CH(n+2) is formed through the first insulating film 232 above the gate lead-out line GD(n+2), and a metal material of the gate line GL2 is filled in the contact hole CH(n+2). A part of the contact hole CH(n+2) where the gate lead-out line GD(n+2) and the metal materials of the gate line GL2 are brought into contact with each other forms the connecting portion CP(n+2), and the gate lead-out line GD(n+2) and the gate line GL2 are electrically connected to each other at the connecting portion CP(n+2). As described above, the gate line GL2 is electrically connected to two gate lead-out lines GD2 and GD(n+2) at two connecting portions CP2 and CP(n+2).

With the above-mentioned configuration, two insulating films (first insulating film 232 and second insulating film 233) are interposed between the gate lead-out line GD and the source line SL, and hence formation of a capacitance between the gate lead-out line GD and the source line SL can be prevented.

Further, as illustrated in FIG. 7 to FIG. 9, each gate lead-out line GD is formed so as to have a width Wd equal to or less than a width Ws of each source line SL (Wd≤Ws). For example, the width Wd of the gate lead-out line GD and the width Ws of the source line SL are both set to 3.5 μm. Further, each gate lead-out line GD and each source line SL are formed to overlap with each other in plan view. For example, each gate lead-out line GD is formed so that the width center thereof substantially matches with the width center of each source line SL. With this, the gate lead-out line GD and a region between the source lines SL (aperture region) do not overlap with each other, and hence reduction in pixel aperture ratio due to formation of the gate lead-out line GD can be prevented.

In this case, a width Wg of the gate line GL is larger than the width Ws of the source line SL and the width Wd of the gate lead-out line GD, and is set to, for example, 18.5 μm. In general, a resistance to a signal (wiring resistance) is increased or decreased based on the length and the width (sectional area) of the wiring through which the signal flows. In this liquid crystal display device 100, the width of the gate lead-out line GD (=3.5 μm) is smaller than the width Wg (=18.5 μm) of the gate line GL. Therefore, for example, the resistance to the gate signal in one gate lead-out line GD is about three times as large as the resistance to the gate signal in one gate line GL. As a result, the entire display region is increased in resistance, which may cause display unevenness. Regarding this point, in this liquid crystal display device 100, two gate lead-out lines GD are electrically connected to one gate line GL. With this, the total width (sectional area) of the gate lead-out lines GD for one gate line GL can be increased (doubled in this case), and hence the resistance to the gate signal can be reduced. Therefore, the reduction in display quality due to display unevenness or the like can be prevented.

In this case, the number of the gate lead-out lines GD electrically connected to one gate line GL is not limited to 2, and may be 3 or more. For example, in the liquid crystal display device 100 having a screen ratio (width:height) of 16:9, four gate lead-out lines GD may be electrically connected to one gate line GL.

Further, it is preferred that the gate lead-out lines GD be arranged in a layer below all of the source lines SL. In this configuration, a gate signal may not be supplied to one of the gate lead-out lines GD. For example, a gate signal may not be supplied to a gate lead-out line GD at which the connecting portion CP is not arranged. With this, the height of the layer can be equalized in the entire display region.

Further, in this liquid crystal display device 100, it is not necessary to electrically connect the plurality of gate lead-out lines GD to each of all of the gate lines GL. For example, in the upper region of the display region 300, one gate lead-out line GD may be electrically connected to one gate line GL, and in the center region of the display region 300, two gate lead-out lines GD may be electrically connected to one gate line GL. Further, in the lower region of the display region 300, three gate lead-out lines GD may be electrically connected to one gate line GL. That is, the number of the gate lead-out lines GD electrically connected to the gate line GL arranged at a position far from a location where the gate driver 220 is arranged may be set to be larger than the number of the gate lead-out lines GD electrically connected to the gate line GL arranged at a position close to the location where the gate driver 220 is arranged. With this, the resistance can be equalized in the entire display region, and the display quality can be enhanced.

Figure 10:
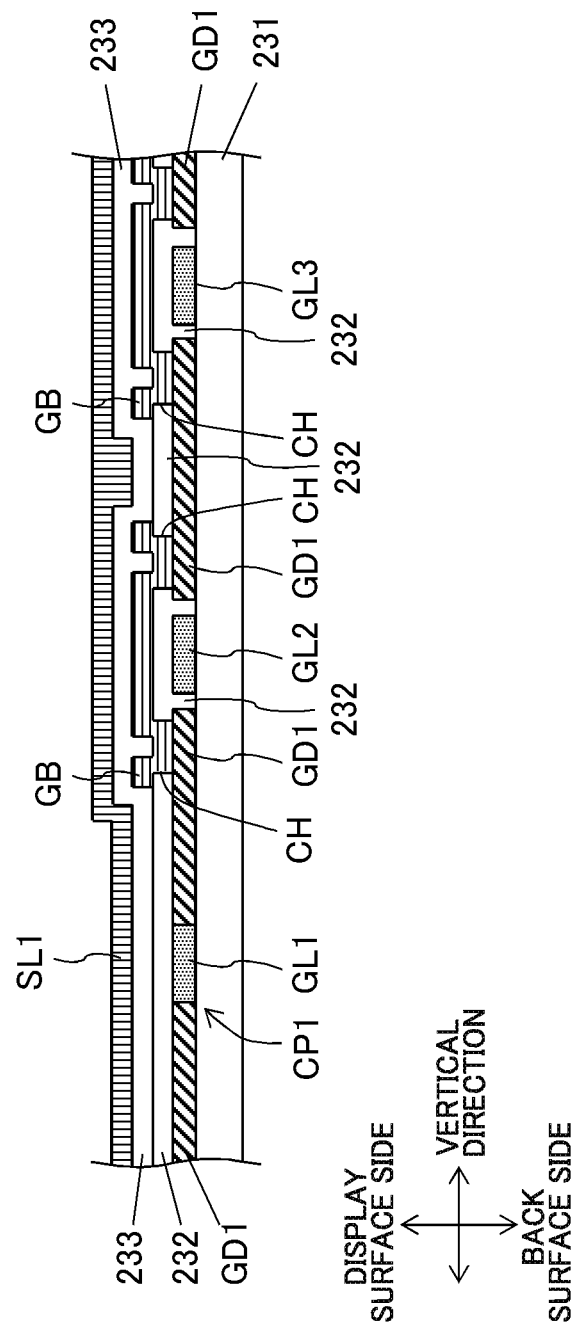
FIG. 10 is a sectional view for illustrating a schematic configuration of the display panel.

Further, in the configuration illustrated in FIG. 7 to FIG. 9, the gate line GL and the gate lead-out line GD are formed in layers different from each other through intermediation of the first insulating film 232, but the lamination structure is not limited thereto. For example, the gate line GL and the gate lead-out line GD may be formed in the same layer. FIG. 10 is a sectional view of a case where the source line SL and the gate lead-out line GD1 are cut in the vertical direction. The gate lead-out line GD is formed in a divided manner between two adjacent gate lines GL within the same plane as the gate line GL. As illustrated in FIG. 10, the gate lines GL and the gate lead-out line GD1 may be formed on the glass substrate 231, and the first insulating film 232 may be formed so as to cover those lines. On the first insulating film 232, bridge lines GB for electrically connecting the divided gate lead-out lines GD in the vertical direction may be formed, and the second insulating film 233 may be formed so as to cover the bridge lines GB. On the second insulating film 233, the source line SL1 may be formed. At the connecting portion CP1, the gate lead-out line GD1 is brought into direct contact with the gate line GL1. The bridge lines GB are formed to cross over the gate lines GL2 and GL3 at the intersecting portions other than the connecting portion CP1. The bridge line GB electrically connects the two divided gate lead-out lines GD1 arranged on both sides of the gate line GL via the contact holes CH formed through the first insulating film 232.

Further, in the configuration illustrated in FIG. 7 to FIG. 9, the layer in which the gate lines GL are formed and the layer in which the gate lead-out lines GD are formed may be reversed. In this case, only one insulating film (second insulating film 233) is interposed between the source line SL and the gate lead-out line GD, and hence it is preferred to increase the thickness of the second insulating film 233.

The liquid crystal display device 100 is not limited to the first embodiment, and the following modes can also be employed. In the following, differences from the first embodiment are mainly described.

Second Embodiment

Figure 11:
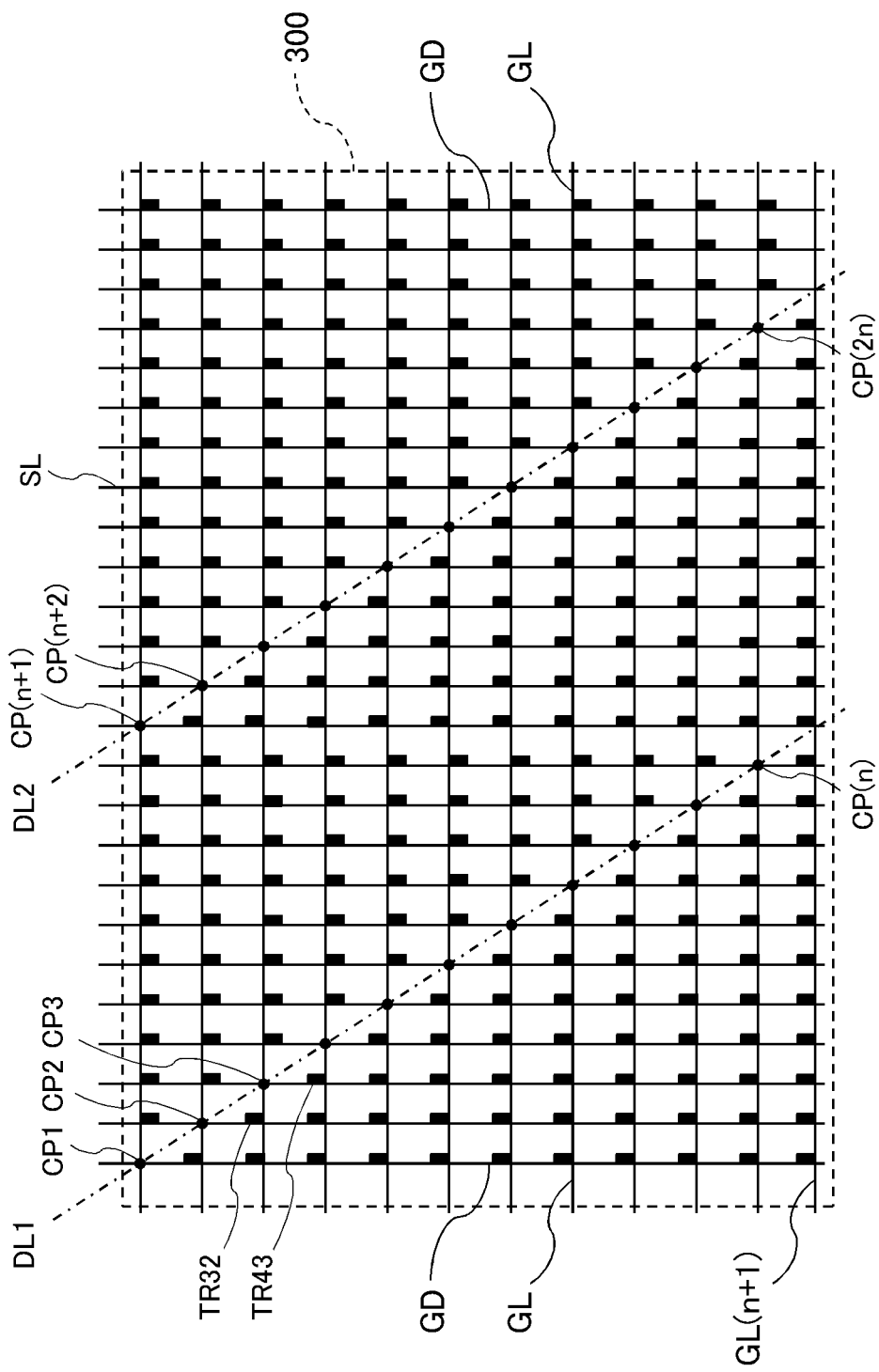
FIG. 11 is a plan view for illustrating arrangement of transistors in a liquid crystal display device according to a second embodiment of the present application.

FIG. 11 is a plan view for illustrating arrangement of the transistors TR in the liquid crystal display device 100 according to a second embodiment of the present application. FIG. 11 is an illustration of positions of the connecting portions CP, and the gate lines GL and the source lines SL connected to the transistors TR. In the liquid crystal display device 100 according to the second embodiment, in the pixel region PA in which the connecting portion CP is arranged, the transistor TR is arranged at the intersecting portion at which the connecting portion CP is not arranged among the four intersecting portions at which two gate lines GL and two source lines SL intersect with each other. For example, as illustrated in FIG. 11, a transistor TR32 is arranged at the lower intersecting portion vertically opposed to the intersecting portion at which the connecting portion CP2 is arranged, and a transistor TR43 is arranged at the lower intersecting portion vertically opposed to the intersecting portion at which a connecting portion CP3 is arranged.

Further, in the display region 300, the regularity of the arrangement of the transistors TR is changed at the position of the connecting portion CP as a boundary. For example, in regions on the vertically upper side with respect to the diagonal lines DL1 and DL2, the transistor TR is arranged at the intersecting portion at the upper left end of the pixel region PA, and in regions on the vertically lower side with respect to the diagonal lines DL1 and DL2, the transistor TR is arranged at the intersecting portion at the lower left end of the pixel region PA.

With the above-mentioned configuration, a distance between the connecting portion CP and the transistor TR can be increased, and hence the potential fluctuations due to the interference of the gate signal and the source signal can be suppressed. Note that, in the liquid crystal display device 100 according to the second embodiment, a gate line GL(n+1) for driving the lowermost end pixels may be added.

Figure 12:
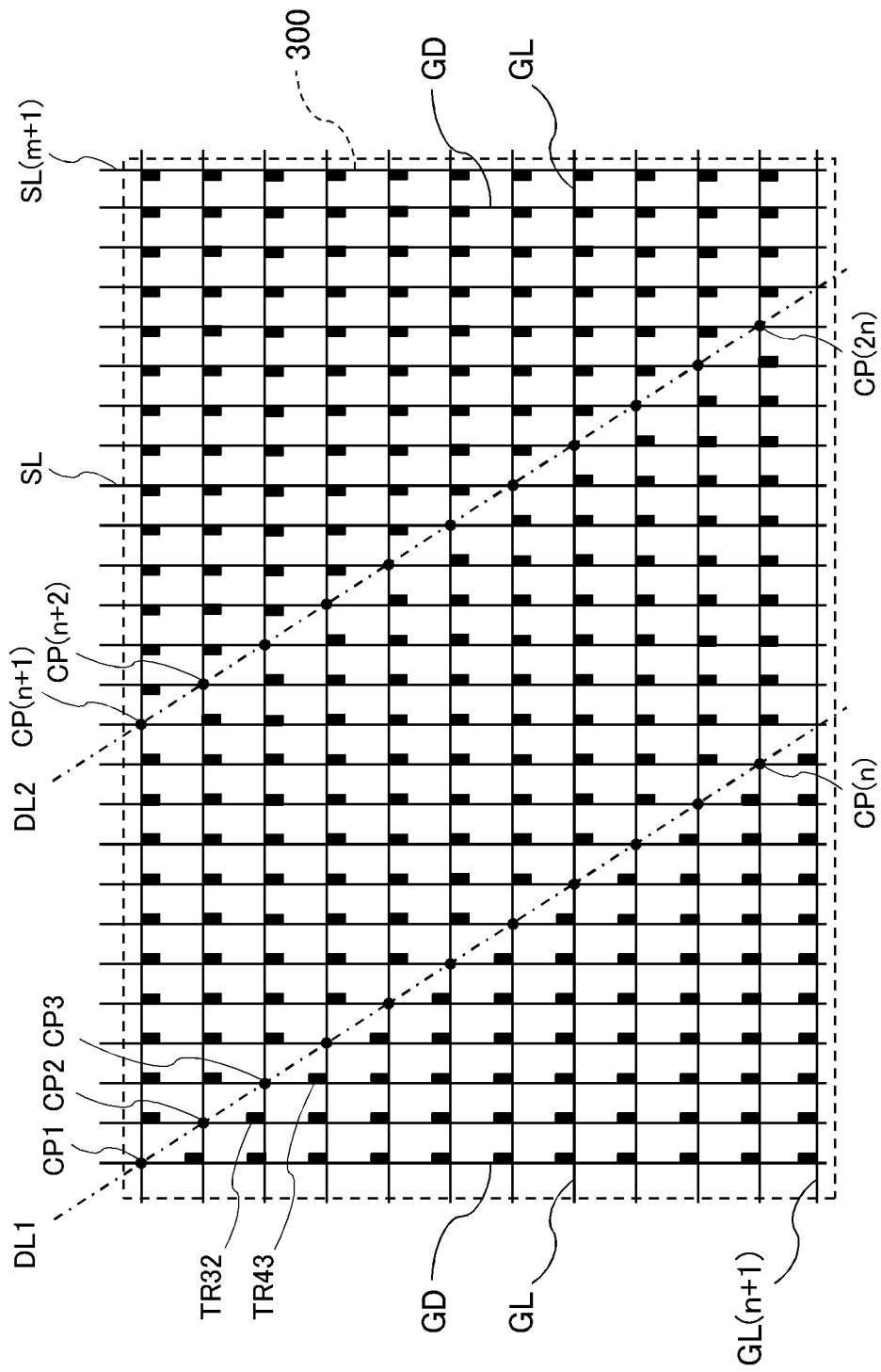
FIG. 12 is a plan view for illustrating arrangement of the transistors in the liquid crystal display device according to the second embodiment.

The arrangement of the transistors TR is not limited to the above-mentioned configuration, and may be a configuration illustrated in FIG. 12. In the configuration illustrated in FIG. 12, in the region on the vertically lower side with respect to the diagonal line DL1, the transistor TR is arranged at the intersecting portion at the lower left end of the pixel region PA, and in a region between the diagonal lines DL1 and DL2, the transistor TR is arranged at the intersecting portion at the upper left end of the pixel region PA. In the region on the vertically upper side with respect to the diagonal line DL2, the transistor TR is arranged at the intersecting portion at the upper right end of the pixel region PA. Note that, in this configuration, a source line SL(m+1) for supplying a source signal to the rightmost end pixels may be added.

Third Embodiment

Figure 13:
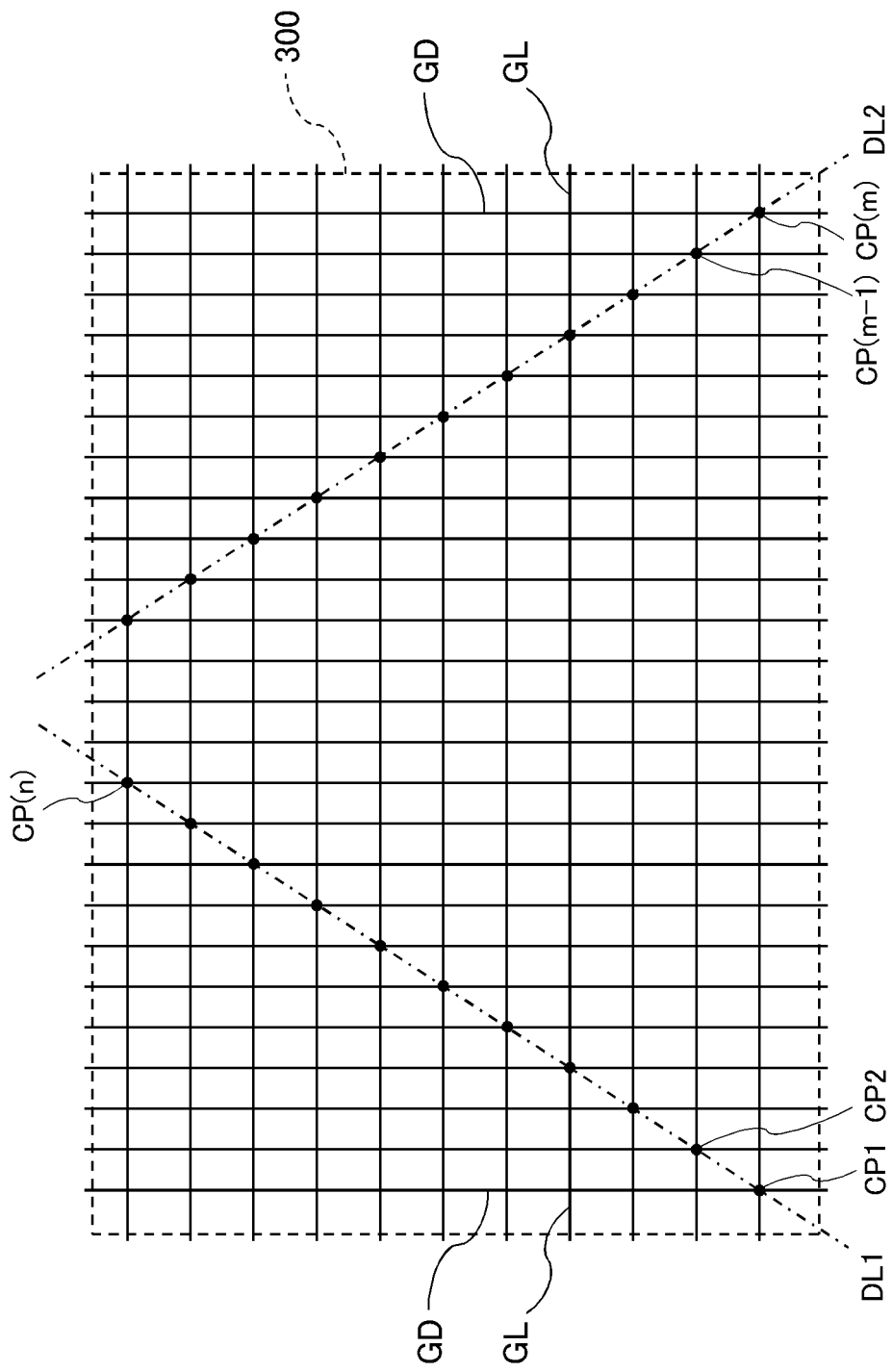
FIG. 13 is a plan view for illustrating arrangement of connecting portions in a liquid crystal display device according to a third embodiment of the present application.

FIG. 13 is a plan view for illustrating arrangement of the connecting portions CP in the liquid crystal display device 100 according to a third embodiment of the present application. In the liquid crystal display device 100 according to the first embodiment, the connecting portions CP are arranged so that the diagonal lines DL1 and DL2 are parallel to each other (see FIG. 5), but in the liquid crystal display device 100 according to the third embodiment, as illustrated in FIG. 13, the connecting portions CP are arranged so as to prevent the diagonal lines DL1 and DL2 from being parallel to each other. For example, as illustrated in FIG. 13, in the display region 300, the connecting portion CP1 is arranged at the lower left end, the connecting portion CP2 is arranged at the upper right of the connecting portion CP1, and the respective connecting portions CP are arranged on the upward-sloping diagonal line DL1. Further, the connecting portion CP(m) is arranged at the lower right end of the display region 300, the connecting portion CP(m−1) is arranged at the upper left of the connecting portion CP(m), and the respective connecting portions CP are arranged on the downward-sloping diagonal line DL2. The above-mentioned variable "m" represents the number of the source lines SL.

In this case, in a configuration in which two gate lead-out lines GD are electrically connected to one gate line GL, when the number (2n) that is twice the number (n) of the gate lines GL is smaller than the number (m) of the source lines SL (2n<m), there are source lines SL not overlapping with the connecting portion CP. In other words, when the gate lead-out lines GD are arranged in a layer below all of the source lines SL, there are dummy gate lead-out lines GD to which the gate signal is not output (not including the connecting portion CP). In this case, it is preferred that the connecting portions CP be arranged from both end sides of the display region 300 so as to prevent the connecting portions CP from being arranged in the center region. In the example of FIG. 13, the connecting portions CP are prevented from being arranged at three center-side source lines SL and three center-side gate lead-out lines GD.

As described above, the connecting portions CP are arranged so that the distance from the gate driver 220 to the connecting portion CP is increased as being distanced from the center toward both the sides of the display region 300. With the above-mentioned configuration, the resistance can be equalized in the entire display region, and the display quality can be enhanced.

Fourth Embodiment

Figure 14:
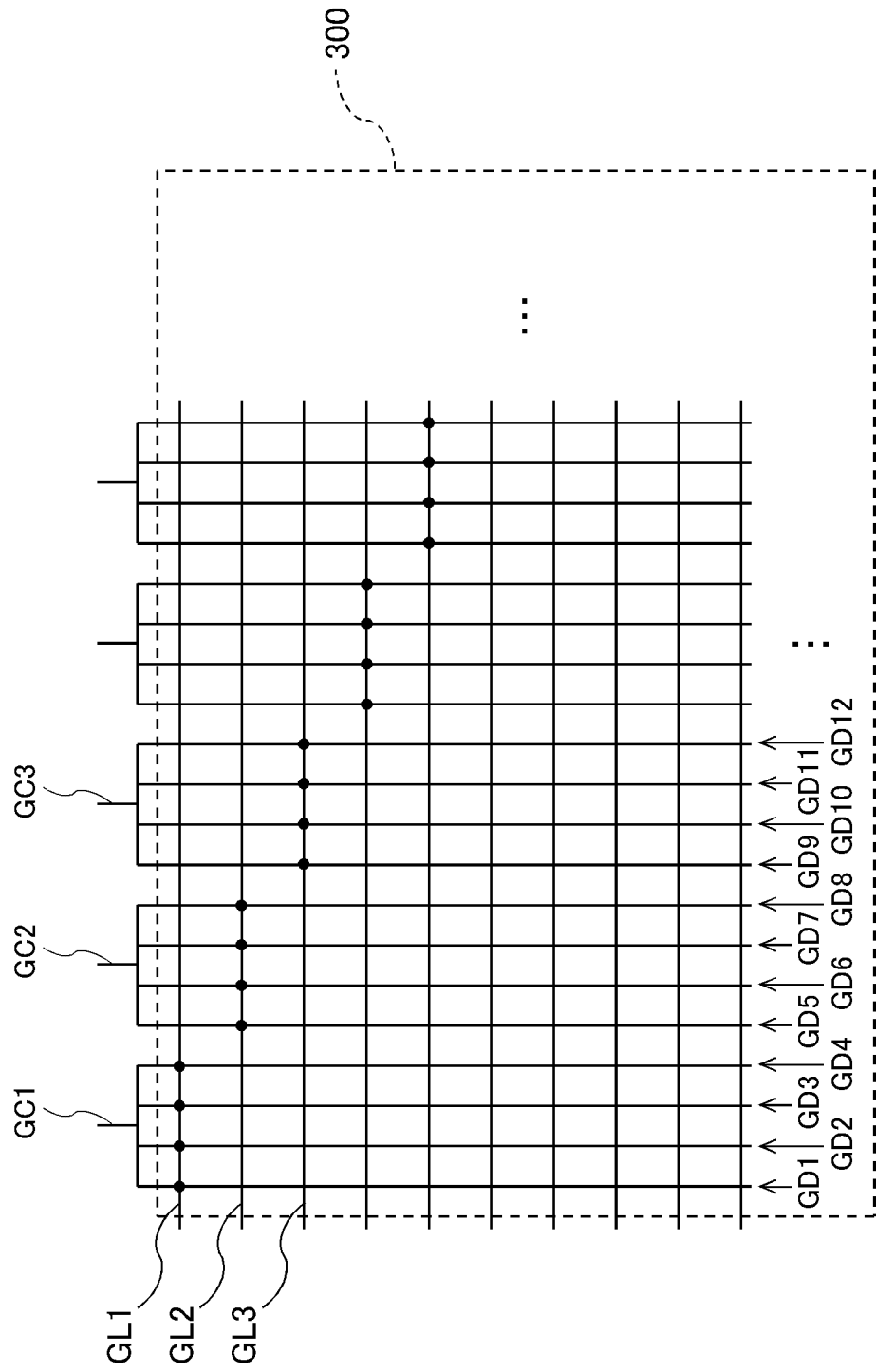
FIG. 14 is a plan view for illustrating arrangement of connecting portions in a liquid crystal display device according to a fourth embodiment of the present application.

FIG. 14 is a plan view for illustrating arrangement of the connecting portions CP in the liquid crystal display device 100 according to a fourth embodiment of the present application. In the liquid crystal display device 100 according to the fourth embodiment, a plurality (predetermined number) of gate lead-out lines GD electrically connected to one gate line GL are bundled into one line outside of the display region on the gate driver 220 side. For example, as illustrated in FIG. 14, gate lead-out lines GD1 to GD4 electrically connected to the gate line GL1 are bundled into one bundled line GC1, gate lead-out lines GD5 to GD8 electrically connected to the gate line GL2 are bundled into one bundled line GC2, and gate lead-out lines GD9 to GD12 electrically connected to the gate line GL3 are bundled into one bundled line GC3. As described above, each gate line GL is electrically connected to a plurality of gate lead-out lines GD adjacent to each other in the horizontal direction.

With the above-mentioned configuration, the number of wirings (bundled line GC and oblique wiring) to be connected to the gate driver 220 can be reduced, and hence the number of the wirings of the driving circuit region 450 can be reduced. Further, the region in the outer periphery of the display region 300 serves as a sealing region for sealing a liquid crystal material. With the above-mentioned configuration, the number of wirings can be reduced, and hence a sealing region can be secured wide.

Fifth Embodiment

Figure 15:
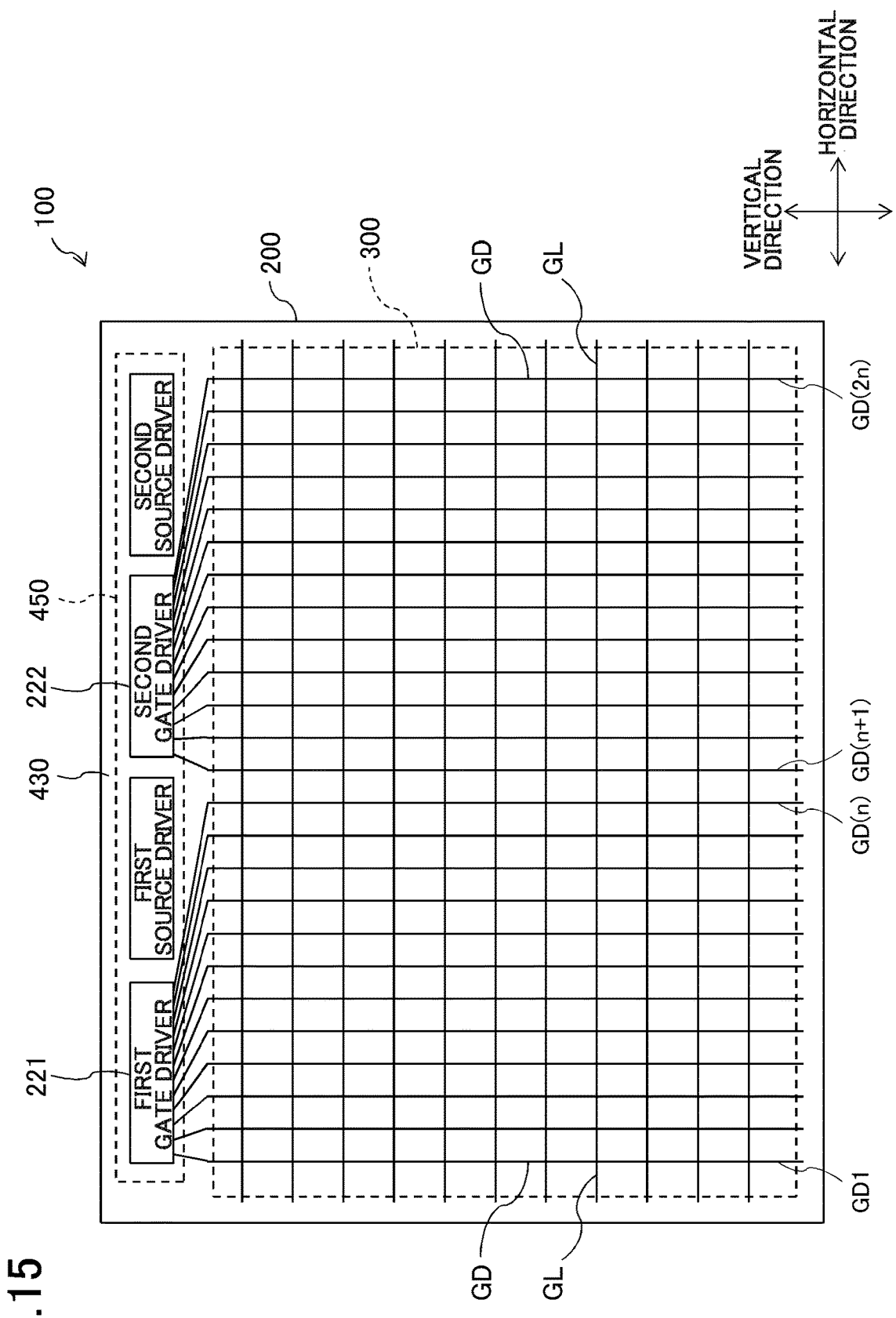
FIG. 15 is a plan view for illustrating arrangement of driving circuits in a liquid crystal display device according to a fifth embodiment of the present application.

FIG. 15 is a plan view for illustrating arrangement of the driving circuits in the liquid crystal display device 100 according to a fifth embodiment of the present application. In the liquid crystal display device 100 according to the fifth embodiment, the gate driver 220 includes a first gate driver 221 and a second gate driver 222. For example, as illustrated in FIG. 15, the first gate driver 221 outputs a gate signal to the gate lead-out lines GD1 to GD(n), and the second gate driver 222 outputs a gate signal to the gate lead-out lines GD(n+1) to GD(2n). Note that, the first gate driver 221 and the second gate driver 222 are controlled to be driven at the same timing, and, for example, the first gate driver 221 and the second gate driver 222 output the same gate signal simultaneously to the gate lead-out lines GD1 and GD(n+1), respectively.

The number of the gate drivers is not particularly limited, and may be determined depending on the number of the gate lead-out lines GD electrically connected to one gate line GL. For example, when three gate lead-out lines GD are electrically connected to one gate line GL, three gate drivers can be provided. Further, when a plurality of source drivers and a plurality of gate drivers are provided, those source drivers and gate drivers are preferred to be alternately arranged laterally.

Sixth Embodiment

FIG. 16 is a sectional view in the liquid crystal display device 100 according to a sixth embodiment of the present application. FIG. 16 is a sectional view of a case where a region along the gate line GL1 is cut in the horizontal direction. In the TFT substrate 230 of the liquid crystal display device 100 according to the sixth embodiment, first gate lead-out lines GDa are formed on the glass substrate 231, the first insulating film 232 is formed so as to cover the first gate lead-out lines GDa, the gate lines GL are formed on the first insulating film 232, the second insulating film 233 is formed so as to cover the gate lines GL, second gate lead-out lines GDb are formed on the second insulating film 233, a fourth insulating film 237 is formed so as to cover the second gate lead-out lines GDb, and the source lines SL are formed on the fourth insulating film 237. Further, as illustrated in FIG. 16, a contact hole CH1a is formed through the first insulating film 232 above a first gate lead-out line GDa1, and a metal material of the gate line GL1 is filled in the contact hole CH1a. Further, a contact hole CH1b is formed through the second insulating film 233 above the gate line GL1, and a metal material of a gate lead-out line GDb1 is filled in the contact hole CH1b. Parts of the contact holes CH1a and CH1b where the gate lead-out lines GDa1 and GDb1 and the metal material of the gate line GL1 are brought into contact with each other form the connecting portion CP1. At the connecting portion CP1, the two gate lead-out lines GDa1 and GDb1 and the gate line GL1 are electrically connected to each other.

As described above, the two gate lead-out lines GD may overlap with each other in plan view, and those lines may be electrically connected to one gate line GL at one connecting portion CP. With this configuration, the present application can also be applied to, for example, a liquid crystal display device having a vertically-long display region 300, in which the number (n) of the gate lines GL is larger than the number (m) of the source lines SL (n>m).

The liquid crystal display devices according to the above-mentioned respective embodiments can be combined with each other in configuration. Further, the respective liquid crystal display devices can be applied to liquid crystal display devices of various modes.

For example, the present application can also be applied to a so-called two-line simultaneous drive liquid crystal display device configured to simultaneously drive two adjacent gate lines GL. In this case, each gate lead-out line GD can be electrically connected to two adjacent gate lines at two connecting portions CP adjacent to each other in the vertical direction.

Further, the present application can also be applied to a so-called vertical divisional drive liquid crystal display device configured to vertically divide the display region to drive the divided regions. In this case, each gate lead-out line GD can be electrically connected to one gate line GL at the connecting portion CP in the upper region, and can be electrically connected to another gate line GL at the connecting portion CP in the lower region.

With the configuration of the display device according to the present application, the frame can be narrowed without reducing the pixel aperture ratio and the display quality.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device, comprising:
a gate driver configured to output a gate signal;
a source driver configured to output a source signal;
a plurality of gate lines extending in a first direction and formed on a display region, including a first gate line and a second gate line;
a plurality of source lines formed on the display region, extending in a second direction different from the first direction and including a first source line and a second source line;
a plurality of gate lead-out lines formed on the display region, extending in the second direction and being configured to transmit the gate signal output from the gate driver to the plurality of gate lines and including a first gate lead-out line and a second gate lead-out line;
a first insulating layer formed on the plurality of gate lines and the plurality of gate lead-out lines; and
a bridge line formed on the first insulating layer above the second gate line, wherein:
the first gate line connects to the first gate lead-out line at a first connecting portion,
the plurality of gate lines and the plurality of gate lead-out lines are formed in a same layer,
the first gate line is arranged at a position closer to a location where the gate driver is arranged than the second gate line,
the first gate lead-out line has a first part and second part,
the second gate line passes through between the first part and the second part,
the bridge line electrically connects the first part to the second part, and
the first connecting portion is disposed between the bridge line and the gate driver.

2. The display device according to claim 1, wherein the display region has a first side being close to the gate driver and a second side being opposite to the first side, and
the first gate lead-out line is extending to the second side of the display region.

3. The display device according to claim 2, wherein the plurality of gate lead-out lines are overlapped with the plurality of source lines in plan view, respectively.

4. The display device according to claim 3, further comprising:
a second insulating layer formed on the bridge line; and
a pixel electrode located between the first source line and the second source line and electrically connected to the first source line, wherein
the first source line is overlapped with the first gate lead-out line in plan view, and
the first source line and the pixel electrode are formed on the second insulating layer.

5. The display device according to claim 4, further comprising:
a third insulating layer formed on the first source line and the pixel electrode; and
a common electrode formed on the third insulating layer.

* * * * *